(12) United States Patent
Hussain

(10) Patent No.: US 10,679,899 B2
(45) Date of Patent: Jun. 9, 2020

(54) SEMICONDUCTOR DEVICE INCLUDING MONOLITHICALLY INTEGRATED PMOS AND NMOS TRANSISTORS

(71) Applicant: KING ABDULLAH UNIVERSITY OF SCIENCE AND TECHNOLOGY, Thuwal (SA)

(72) Inventor: Aftab Hussain, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 16/311,911

(22) PCT Filed: Aug. 7, 2017

(86) PCT No.: PCT/IB2017/054823
§ 371 (c)(1),
(2) Date: Dec. 20, 2018

(87) PCT Pub. No.: WO2018/029594
PCT Pub. Date: Feb. 15, 2018

(65) Prior Publication Data
US 2019/0214304 A1 Jul. 11, 2019

Related U.S. Application Data

(60) Provisional application No. 62/372,669, filed on Aug. 9, 2016.

(51) Int. Cl.
*H01L 21/822* (2006.01)
*H01L 21/8238* (2006.01)
(Continued)

(52) U.S. Cl.
CPC .. *H01L 21/8221* (2013.01); *H01L 21/823828* (2013.01); *H01L 27/0688* (2013.01); *H01L 21/2007* (2013.01)

(58) Field of Classification Search
CPC ......... H01L 21/8221; H01L 21/823828; H01L 21/2007; H01L 27/0688
See application file for complete search history.

(56) References Cited

U.S. PATENT DOCUMENTS 6,274,894 B1 * 8/2001 Wieczorek .......... H01L 29/0847
257/192
7,670,927 B2 * 3/2010 Bernstein .............. H01L 23/481
257/E25.027

(Continued)

OTHER PUBLICATIONS

International Search Report dated Nov. 3, 2017, in corresponding/related International Application No. PCT/IB2017/054823.
(Continued)

*Primary Examiner* — Christine A Enad
(74) *Attorney, Agent, or Firm* — Patent Portfolio Builders PLLC

(57) ABSTRACT

A method for producing a semiconductor device involves forming a first transistor having a silicon substrate and a gate, and forming a second transistor, having a germanium substrate, on top of the first transistor. The second transistor is formed by forming a first gate of the second transistor on top of, and electrically coupled to, the gate of the first transistor, bonding the germanium substrate to the first gate of the second transistor so that the bonding does not damage the first transistor, and forming a second gate of the second transistor on the germanium substrate.

20 Claims, 7 Drawing Sheets

(51) Int. Cl.
  *H01L 27/06* (2006.01)
  *H01L 21/20* (2006.01)

(56) References Cited

U.S. PATENT DOCUMENTS

| | | | |
|---|---|---|---|
| 9,281,305 B1* | 3/2016 | Yang | H01L 29/41783 |
| 2003/0017679 A1* | 1/2003 | Lee | H01L 21/76251 |
| | | | 438/455 |
| 2010/0117238 A1 | 5/2010 | Nemouchi et al. | |
| 2011/0147849 A1* | 6/2011 | Augendre | H01L 21/8221 |
| | | | 257/368 |
| 2011/0199116 A1 | 8/2011 | Or-Bach et al. | |
| 2011/0248354 A1 | 10/2011 | Xiao et al. | |
| 2013/0015900 A1* | 1/2013 | Lisart | G06F 21/72 |
| | | | 327/306 |

OTHER PUBLICATIONS

Written Opinion of the International Searching Authority dated Nov. 3, 2017, in corresponding/related International Application No. PCT/IB2017/054823.

European Office Action for related European Application No. 17761925.1 dated Apr. 14, 2020.

* cited by examiner

SEMICONDUCTOR DEVICE INCLUDING MONOLITHICALLY INTEGRATED PMOS AND NMOS TRANSISTORS

CROSS-REFERENCE TO RELATED APPLICATION

This application claims priority and benefit from U.S. Provisional Patent Application No. 62/372,669, filed Aug. 9, 2016, for "HETEROGENEOUS INTEGRATED PMOS AND NMOS DEVICES FOR CMOS CIRCUITRY," the entire contents of which are incorporated in their entirety herein by reference.

BACKGROUND

Technical Field

Embodiments of the subject matter disclosed herein generally relate to a semiconductor device including monolithically integrated PMOS and NMOS transistors and a method of producing such semiconductor devices.

Discussion of the Background

As more capabilities are being added to electronic devices, there is a need to accommodate more transistors within a defined area of the electronic devices. This can be addressed by reducing the amount of surface area occupied by transistors, which allows increased transistor density. There is also a need to reduce the size of electronic devices, which likewise can be achieved by reducing the surface area occupied by transistors. However, reducing the surface area occupied by a transistor typically requires reducing the channel length, which can result in undesirable effects, commonly referred to as short channel effects.

Moreover, as the number and types of devices that are battery powered continues to increase, there is also a desire to reduce the power consumption of transistors.

Accordingly, there is a need for semiconductor devices that have reduced surface area, reduced power consumption, and do not experience the short channel effects typically encountered when reducing the channel length.

SUMMARY

According to an embodiment, there is a method for producing a semiconductor device. The method involves forming a first transistor having a silicon substrate and a gate, and forming a second transistor, having a germanium substrate, on top of the first transistor. The second transistor is formed by forming a first gate of the second transistor on top of, and electrically coupled to, the gate of the first transistor, bonding the germanium substrate to the first gate of the second transistor so that the bonding does not damage the first transistor, and forming a second gate of the second transistor on the germanium substrate.

According to another embodiment, there is a semiconductor device, which includes a first transistor having a silicon substrate, and a second transistor having a germanium substrate. The second transistor comprises a first gate arranged on a first side of the germanium substrate and a second gate arranged on a second side of the germanium substrate. The first gate of the second transistor is arranged on a gate of the first transistor with an electrically conductive contact arranged between the first gate of the second transistor and the gate of the first transistor.

According to a further embodiment, there is a method for producing a semiconductor device. The method involves forming a first transistor having a gate on a silicon substrate. The silicon substrate includes a source, drain, and channel. The method also includes forming a second transistor having a first gate arranged on a first side of a germanium substrate and a second gate arranged on a second side of the germanium substrate. The germanium substrate includes a source, drain, and channel. The second transistor includes a dielectric interposed between the first gate of the second transistor and the germanium substrate and the formation of the second transistor comprises bonding the germanium substrate to the dielectric so that the bonding does not damage the first transistor.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

Figure 1:
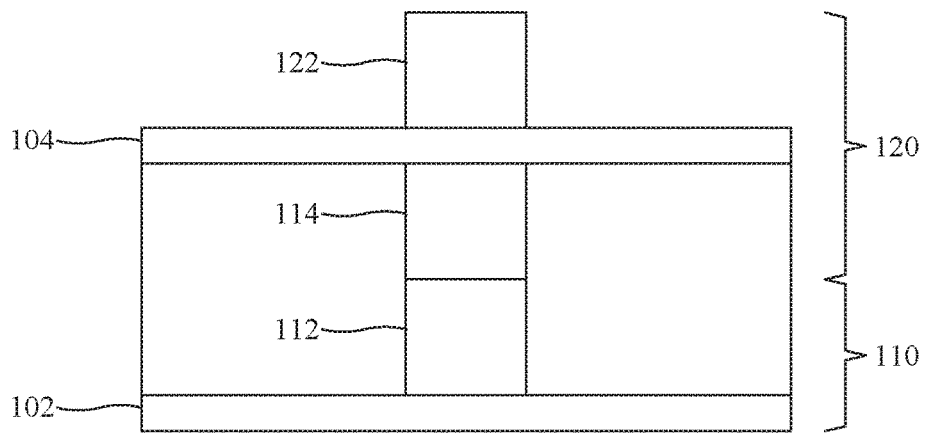
FIG. 1 is a cross-sectional view illustrating an integrated circuit with stacked dual gate p-type metal-oxide-semiconductor (PMOS) and n-type metal-oxide-semiconductor (NMOS) according to an embodiment.

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of semiconductor devices.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

According to an embodiment there is a method for producing a semiconductor device. Specifically, referring to FIGS. 1 and 2, the method involves forming a first transistor 110 having a silicon substrate 102 and a gate 112 (step 210) and forming a second transistor 120, having a germanium substrate 104, on top of the first transistor 110 (step 220). The formation of the second transistor involves forming a first gate 114 of the second transistor 120 on top of, and electrically coupled to, the gate 112 of the first transistor 110 (step 220A). In one application, first gate 114 is directly coupled (electrically and mechanically) to the gate 112. The germanium substrate 104 is then bonded to the first gate 114 of the second transistor 120 so that the bonding does not damage the first transistor (step 220B). Finally, a second gate 122 of the second transistor 120 is formed on the germanium substrate 104 (step 220C). Accordingly, the semiconductor device 100 includes a single gate n-type metal-oxide-semiconductor (NMOS) transistor 110 on a silicon substrate 102 and a dual gate p-type metal-oxide-semiconductor (PMOS) transistor 120 on a germanium substrate 104.

A semiconductor device with a dual gate PMOS transistor 120 arranged on top of a single gate NMOS transistor 110 reduces the surface area occupied by these two transistors. Further, the dual gate PMOS transistor 120 not only reduces the surface area of the PMOS transistor 120 but also addresses the short channel effects normally encountered by reducing the transistor channel length.

Figure 3:
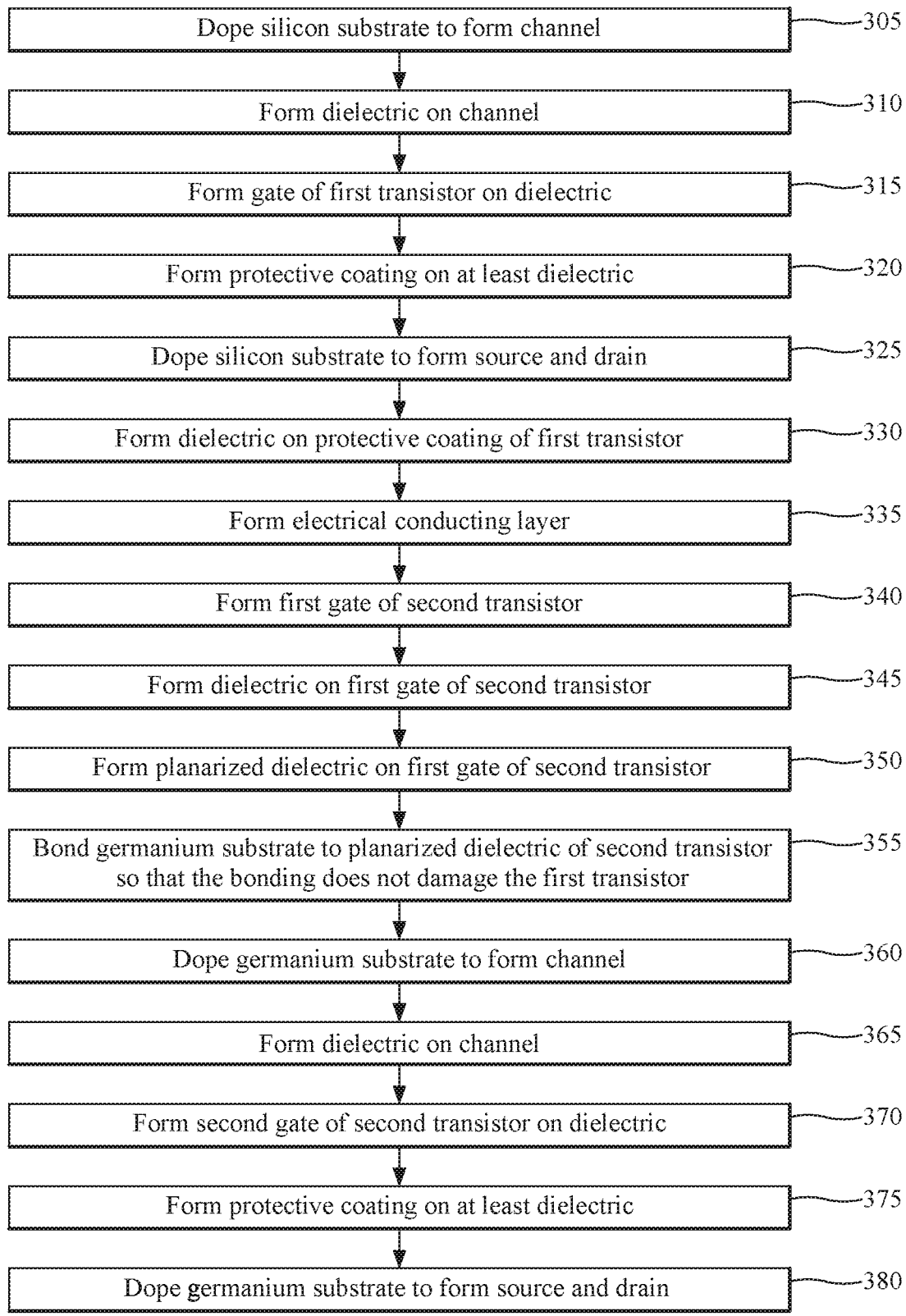
FIG. 3 is a flow chart illustrating a method for manufacturing monolithically integrated PMOS and NMOS devices using silicon and germanium semiconductors according to an embodiment.

Additional details of a method of manufacturing a semiconductor device with a dual gate PMOS transistor formed on top of a single gate NMOS transistor will now be described in connection with the flow chart of FIG. 3 and the cross-sectional views of FIGS. 4A-4I.

Figure 4A:
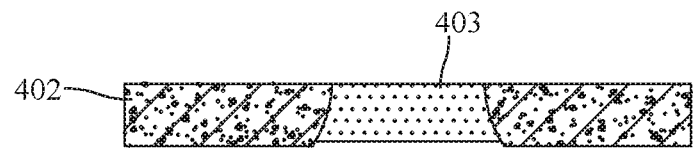
FIGS. 4A-4I are cross-sectional views illustrating manufacturing of monolithically integrated PMOS and NMOS devices according to an embodiment.
Figure 4B:
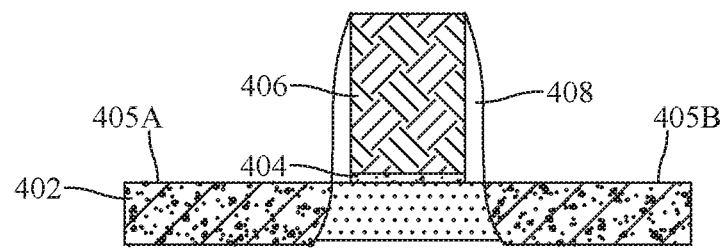
Figure 4C:
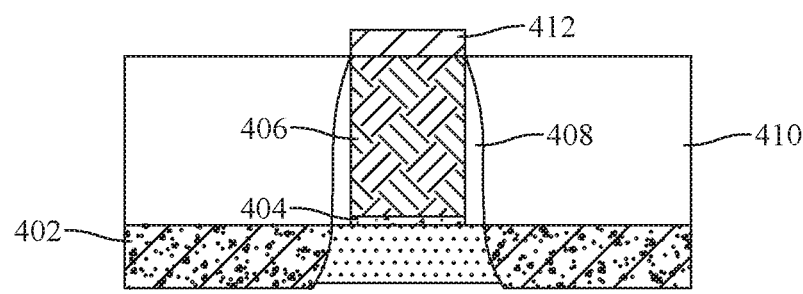
Figure 4D:
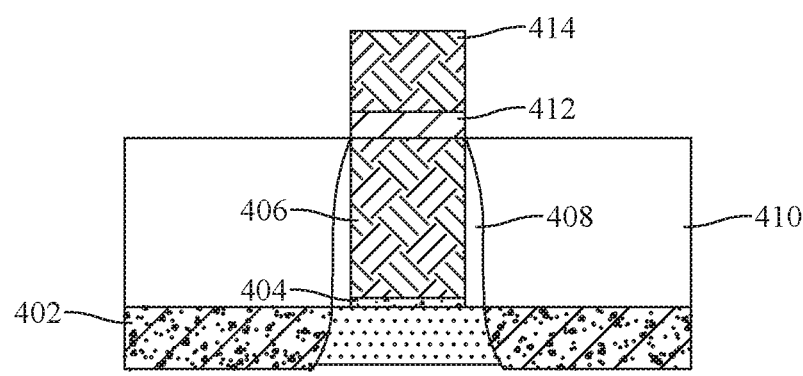

Initially, a silicon substrate 402 is doped to form a channel 403 (step 305 and FIG. 4A). The silicon substrate 402 can be, for example, a silicon-on-insulator (SOI) substrate. A dielectric 404 is formed on the channel 403 (step 310 and FIG. 4B), a gate 406 is formed on the dielectric 404 (step 315), and then a protective coating 408 is formed on at least the dielectric 404 (step 320). The dielectric 404 can be, for example, a high-K dielectric, comprising hafnium silicate, zirconium silicate, hafnium dioxide, and/or zirconium dioxide. The silicon substrate 402 is then doped to form a source and drain 405A and 405B (step 325). The protective coating 408 can be in the form of, for example, a nitride spacer, and is intended to protect the dielectric from the doping used to form the source and drain 405A and 405B.

A dielectric 410 is then formed on the protective coating and the semiconductor substrate 402 (step 330 and FIG. 4C), and an electrical conducting layer 412 is formed on the dielectric 410 (step 335). The electrical conducting layer 412 can be non-metallic or metallic (e.g., a copper metal or alloy). The dielectric 410 provides a planarized surface for the second transistor. The dielectric 410 can be a spin-on dielectric and the formation of the dielectric 410 can involve etching the dielectric 410, chemically and/or physically, to level the dielectric 410 at a height approximately near the height of the gate 406. The first gate 414 of the second transistor is then formed on the electrical conducting layer 412 (step 340 and FIG. 4D).

Figure 4E:
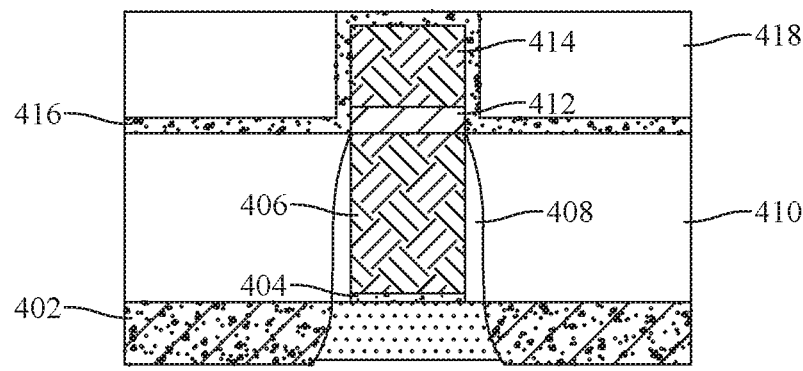

A dielectric 416, such as a high-K dielectric, is formed over the dielectric 410 of the first transistor, the contact metal 412, and the first gate 414 of the second transistor (step 345 and FIG. 4E). A second dielectric 418 is then formed over the dielectric 416 to provide a planarized surface for the germanium substrate (step 350 and FIG. 4E). The dielectric 418 can be a spin-on dielectric and the formation of the dielectric 418 can involve etching the dielectric 418, chemically and/or physically, to level the dielectric 418 at a height approximately near the height of the first gate 414 of the second transistor.

Figure 4F:
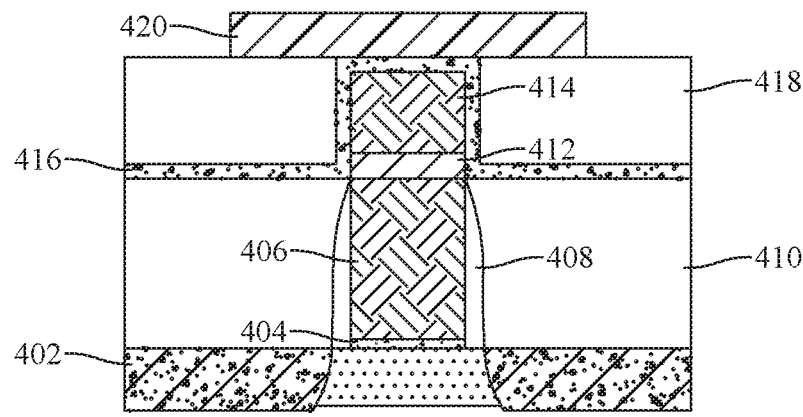

A germanium substrate 420 of the second transistor is then bonded to the planarized dielectric 418 so that the bonding does not damage the first transistor (step 355 and FIG. 4F). The germanium substrate 420 may be patterned to isolate the first transistor. The germanium substrate 420 can be comprised of, for example, single crystal germanium. Damage to the first transistor occurs when the first transistor is subjected to certain high temperatures and affects the performance of the first transistor. One type of damage to the first transistor can be silicidation of the first transistor. Silicidation, as well as other types of damage to the first transistor, can be prevented during bonding in a number of different ways. One way to prevent damage is to use a low temperature during bonding, such as a bonding process that operates at or below 250° C., and in some embodiments one that operates at or below 200° C. Bonding processes operating above 250° C. can also be employed so long as the heating is localized and does not occur across the entire surface of the dielectric 418. The types of wafer bonding that can be employed include, but are not limited to, direct bonding, surface activated bonding, plasma activated bonding, anodic bonding, eutectic bonding, glass frit bonding, adhesive bonding, thermocompression bonding, reactive bonding, and/or transient liquid phase diffusion bonding. The wafer bonding allows the placement of a single crystal semiconductor layer, such as single crystal germanium in the dual gate structure.

Figure 4G:
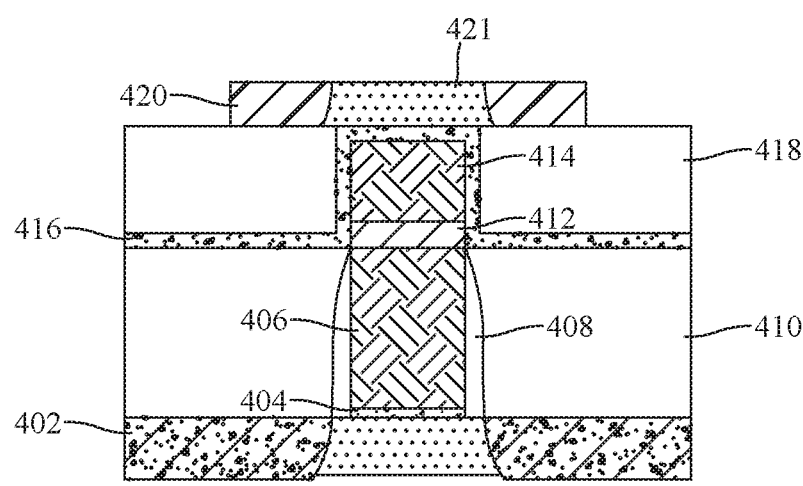
Figure 4H:
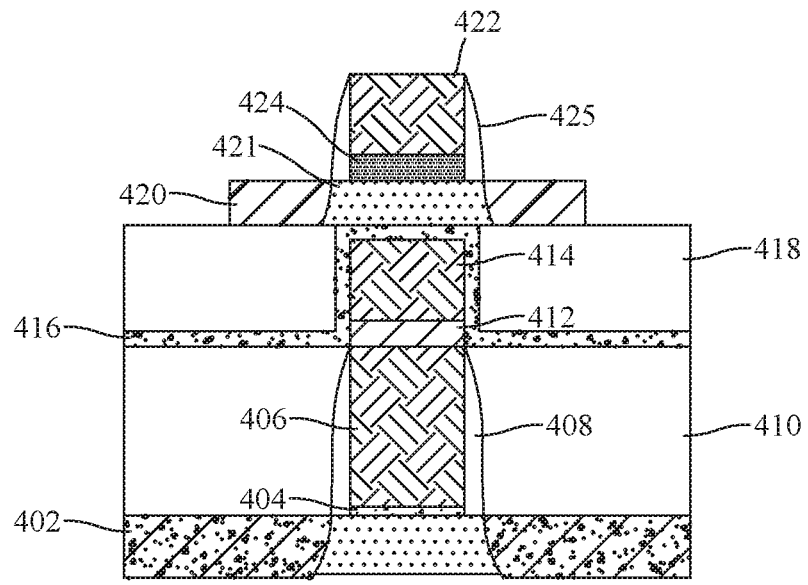
Figure 4I:
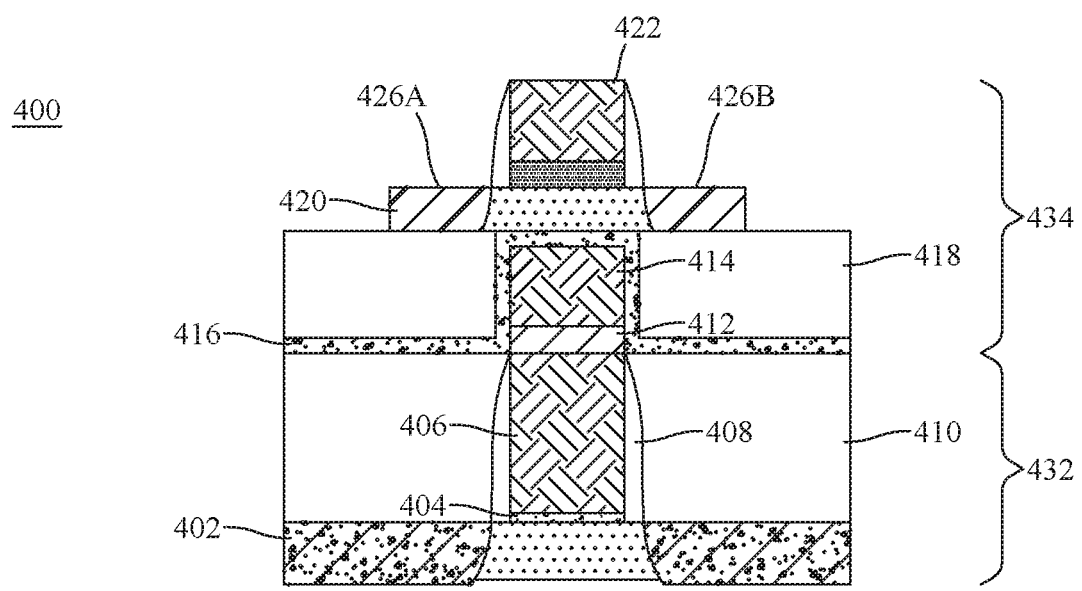

The germanium substrate 420 is doped to form the channel 421 of the second transistor (step 360 and FIG. 4G). A dielectric 424 is formed on the channel 421 (step 365 and FIG. 4H) and a second gate 422 of the second transistor is formed on the dielectric 424 (step 370). A protective coating 425, which can be in the form of a nitride spacer, is applied to at least the dielectric 424 to protect it from the subsequent doping (step 375). Finally, the germanium substrate is doped to form the source and drain 426A and 426B (step 380). Accordingly, the method produces a semiconductor device having a dual gate PMOS 434 having a germanium substrate 420 formed on a single gate NMOS 432 formed on a silicon substrate 402.

Figure 5:
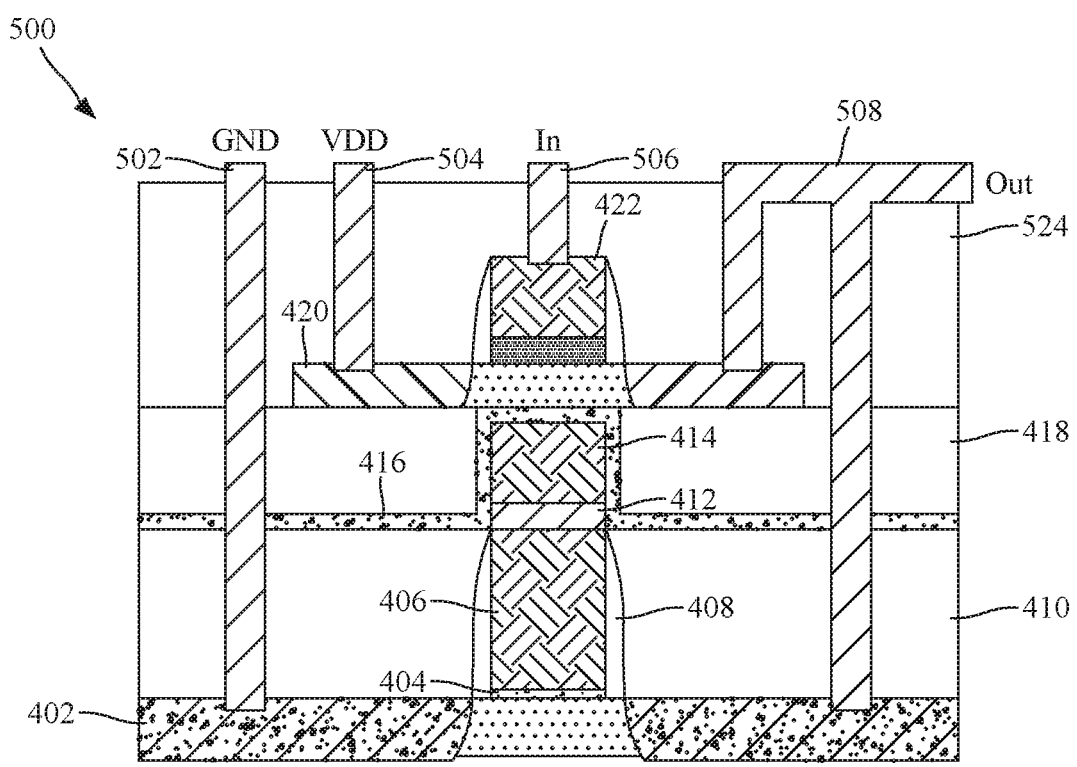
FIG. 5 is a cross-sectional view illustrating an inverter formed from monolithically integrated PMOS and NMOS transistors according to an embodiment.

A semiconductor device including monolithically integrated PMOS and NMOS transistors, such as those described above and/or manufactured according to the methods described above, may be used to form CMOS logic gates, such as NAND or NOR logic gates, or an inverter. FIG. 5 illustrates one example of a semiconductor device in the form of an inverter formed from monolithically integrated PMOS and NMOS transistors. An inverter 500 may be configured using an integrated circuit (IC) similar to that shown in FIG. 4I. Inputs and outputs to the integrated circuit may be provided through vias, lines, and/or other conductors coupled to various structures of the integrated circuit. A ground node may be coupled through via 502 to a source or drain in the silicon substrate 402 of the first transistor. A power supply (VDD) node may be coupled through via 504 to a source or drain in the germanium substrate 420 of the second transistor. An input node (IN) may be coupled through via 506 to the second gate 422 of the second transistor. An output node (OUT) may be coupled through line and via 508 to a source or drain of the germanium substrate 420 of the second transistor and a source or drain of the silicon substrate 402 of the first transistor. Further, in this embodiment, a planarized dielectric 524 is formed on top of the second gate 422 of the second transistor.

Although an inverter is shown in FIG. 5, the dual gate design and manufacturing of same may be applied to other logic circuitry. The design may improve density of the circuitry and may reduce power dissipation in the circuitry. These improvements are particularly advantageous in, for example, mobile applications, where complicated electronic circuitry is integrated in a small area and power dissipation is a concern.

Figure 2:
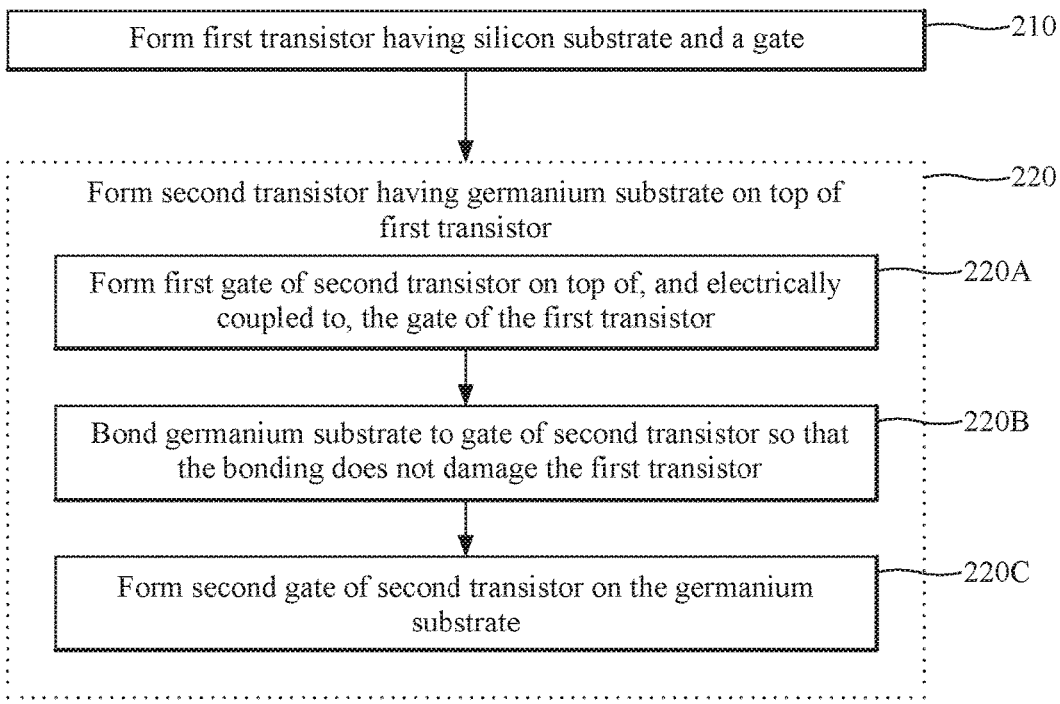
FIG. 2 is a flow chart illustrating a method for manufacturing monolithically integrated PMOS and NMOS devices according to an embodiment.

A dual gate design for PMOS circuitry in a logic gate may reduce short channel effects experienced by conventional transistor structures that reduces performance. Thus, the dual gate design of a logic gate, such as shown in the examples of FIGS. 1 and 5, may have better subthreshold slope, lower leakage current, and better drain-induced barrier lowering (DIBL). The top and bottom gate of the germanium-based PMOS circuitry may improve likelihood of complete inversion of the channel area in the silicon substrate of the first transistor, thus providing improved performance of the device. Additionally, the dual gate design improves the switching performance by reducing the switching current and/or reducing the turn-on time for the germanium-based PMOS circuitry. This reduces the power dissipation in the circuits, and thus improve battery life of mobile devices built from the dual gate logic circuitry.

Figure 6:
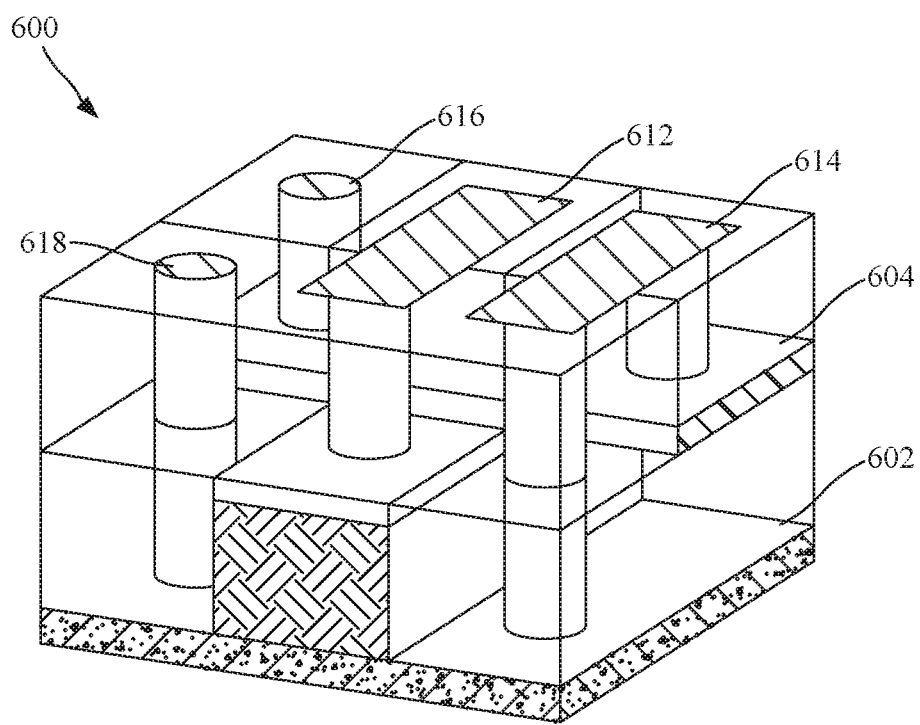
FIG. 6 is a perspective view of a stacked, heterogeneous CMOS circuit configured as a CMOS inverter according to an embodiment.

A perspective view of a semiconductor device in the form of an inverter formed from monolithically integrated PMOS and NMOS transistors is illustrated in FIG. 6. An inverter 600 may include a ground input node 618 coupled to the semiconductor substrate 602 of the first transistor and a power supply (Vdd) input node 616 coupled to the germanium substrate 604 of the second transistor. An input signal may be applied to an input node 612. The inverter 600 may invert the value received at the input node 612, and output the inverted results at an output node 614. For example, when a logic '1' is applied to the input node 612, a logic '0' may be output at the output node 614.

The disclosed embodiments provide methods of producing a semiconductor device including monolithically integrated PMOS and NMOS transistors. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method for producing a semiconductor device, comprising:
    forming a first transistor having a silicon substrate and a gate;
    forming an electrical conducting layer directly on the gate of the first transistor; and
    forming a second transistor, having a germanium substrate, on top of the first transistor by
    forming a first gate of the second transistor directly on top of the electrical contacting layer to be electrically coupled to the gate of the first transistor;
    bonding the germanium substrate to the first gate of the second transistor so that the bonding does not damage the first transistor; and
    forming a second gate of the second transistor on the germanium substrate.

2. The method of claim 1, wherein the first gate is formed on top of the gate of the first transistor on a first side of the germanium substrate, and the second gate is formed on a second side of the germanium substrate.

3. The method of claim 1, wherein the electrical conducting layer is formed on the gate of the first transistor prior to forming the first gate of the second transistor so that the gate of the first transistor is electrically coupled to the first gate of the second transistor.

4. The method of claim 1, wherein the formation of the first transistor comprises:
    doping the silicon substrate to form a channel;
    forming a dielectric layer on the channel;
    forming the gate on the dielectric layer;
    forming a protective coating at least on the dielectric; and
    doping the silicon substrate to form a source and drain.

5. The method of claim 1, wherein formation of the second transistor further comprises:
    forming a dielectric layer on the first gate of the second transistor, wherein the germanium substrate is bonded to the first gate of the second transistor via the dielectric layer;
    doping the germanium substrate to form a channel, source, and drain.

6. The method of claim 1, wherein the first transistor is n-type metal-oxide-semiconductor (NMOS) and the second transistor is a p-type metal-oxide-semiconductor (PMOS).

7. The method of claim 1, wherein the bonding is performed at a temperature that does not damage the first transistor during the bonding.

8. The method of claim 7, wherein the bonding comprises applying a localized heating of the germanium substrate to prevent damaging the first transistor during bonding.

9. The method of claim 7, wherein the bonding involves applying temperatures less than 250° C. to the germanium substrate.

10. A semiconductor device, comprising:
    a first transistor having a silicon substrate; and
    a second transistor having a germanium substrate,
    wherein the second transistor comprises a first gate arranged on a first side of the germanium substrate and a second gate arranged on a second side of the germanium substrate,
    wherein the first gate of the second transistor is directly formed on an electrical conducting layer, which is directly formed on a gate of the first transistor.

11. The semiconductor device of claim 10, wherein a first dielectric is interposed between the first gate of the second transistor and the first side of the germanium substrate and a second dielectric is interposed between the second gate of the second transistor and the second side of the germanium substrate.

12. The semiconductor device of claim 11, wherein the germanium substrate is bonded to the first dielectric in a process that does not damage the first transistor during bonding.

13. The semiconductor device of claim 10, wherein the first and second transistors form an inverter.

14. A method for producing a semiconductor device, comprising:
    forming a first transistor having a gate on a silicon substrate, wherein the silicon substrate includes a source, drain, and channel;
    forming an electrical conducting layer directly on the gate of the first transistor; and
    forming a second transistor having a first gate arranged on a first side of a germanium substrate and a second gate arranged on a second side of the germanium substrate, wherein the germanium substrate includes a source, drain, and channel,
    wherein the electrical conducting layer is directly formed on the first gate of the second transistor, and
    wherein the second transistor includes a dielectric interposed between the first gate of the second transistor and the germanium substrate and the formation of the second transistor comprises bonding the germanium substrate to the dielectric so that the bonding does not damage the first transistor.

15. The method of claim 14, wherein the formation of the first transistor comprises:
    doping the silicon substrate to form a p-type channel; and
    doping the silicon substrate to form an n-type source and drain.

16. The method of claim 15, wherein the formation of the second transistor comprises:
    doping the germanium substrate to form an n-type channel; and
    doping the germanium substrate to form a p-type source and drain.

17. The method of claim 15, wherein the bonding is performed at a temperature that does not damage the first transistor during the bonding.

18. The method of claim 17, wherein the bonding comprises applying a localized heating of the germanium substrate to prevent damaging the first transistor during bonding.

19. The method of claim 17, wherein the bonding involves applying temperatures less than 250° C. to the germanium substrate.

20. The method of claim 15, wherein the semiconductor device is an inverter, and the method further comprises:
    coupling the source of the first transistor to a ground terminal;
    coupling the source of the second transistor to a supply terminal;
    coupling the second gate of the second transistor to an input terminal; and
    coupling the drain of the first transistor and the drain of the second transistor to a common output terminal.

* * * * *